United States Patent
Lee et al.

(10) Patent No.: US 10,546,948 B1
(45) Date of Patent: Jan. 28, 2020

(54) ELECTRONIC DEVICE INCLUDING AN INSULATED GATE BIPOLAR TRANSISTOR HAVING A FIELD-STOP REGION AND A PROCESS OF FORMING THE SAME

(71) Applicant: SEMICONDUCTOR COMPONENTS INDUSTRIES, LLC, Phoenix, AZ (US)

(72) Inventors: Meng-Chia Lee, Chubbuck, ID (US); Ralph N. Wall, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/128,267

(22) Filed: Sep. 11, 2018

(51) Int. Cl.
| E21B 49/00 | (2006.01) |
| H01L 29/739 | (2006.01) |
| H01L 21/265 | (2006.01) |
| H01L 29/66 | (2006.01) |
| H01L 29/06 | (2006.01) |

(52) U.S. Cl.
CPC .... *H01L 29/7397* (2013.01); *H01L 21/26586* (2013.01); *H01L 29/0623* (2013.01); *H01L 29/66348* (2013.01)

(58) Field of Classification Search
CPC ... H01L 29/66234–66348; H01L 29/73–7378; H01L 29/739–7398; H01L 2924/1305–13056; H01L 29/0804–0834; H01L 29/1004; H01L 29/41708; H01L 29/42304; H01L 29/7375; H01L 29/7393–7395; H01L 29/7397
See application file for complete search history.

(56) References Cited

U.S. PATENT DOCUMENTS

| 7,635,892 B2 | 12/2009 | Tokuda et al. |
| 7,838,926 B2 | 11/2010 | Tsukuda et al. |
| 8,039,322 B2 * | 10/2011 | Iwabuchi ............ H01L 29/0653 257/E29.183 |
| 8,502,345 B2 * | 8/2013 | Nemoto ................ H01L 29/739 257/288 |
| 9,818,837 B2 | 11/2017 | Grivna |

(Continued)

OTHER PUBLICATIONS

Jiang et al.; "An Insulated-Gate Bipolar Transistor with a Collector Trench Electron Extraction Channel"; IEEE Electron Device Letters; vol. 36, No. 9;.2015; pp. 935-937.

*Primary Examiner* — Cuong B Nguyen
(74) *Attorney, Agent, or Firm* — Abel Schillinger, LLP

(57) ABSTRACT

An electronic device can include a semiconductor substrate having a front side and a back side; an emitter region closer to the front side than to the back side; a trench extending from a back side surface into the semiconductor substrate, wherein the trench has a sidewall and a bottom; a collector region along the back side surface and spaced apart from the bottom of the trench; a field-stop region lying along the bottom and at least a portion of the sidewall of the trench, wherein the emitter and field-stop regions have one conductivity type, and the collector region has the opposite conductivity type; and a collector terminal along the back side and including a metal-containing material, wherein the collector terminal contacts the collector region and is isolated from the field-stop region. A process of forming the electronic device does not require complex or marginal processing operations.

20 Claims, 6 Drawing Sheets

(56) References Cited

U.S. PATENT DOCUMENTS

2002/0137264 A1    9/2002   Kao et al.
2009/0315071 A1   12/2009   Iwabuchi et al.
2015/0279980 A1   10/2015   Chen et al.

\* cited by examiner ic Table of Elements based on the IUPAC Periodic Table
ELECTRONIC DEVICE INCLUDING AN INSULATED GATE BIPOLAR TRANSISTOR HAVING A FIELD-STOP REGION AND A PROCESS OF FORMING THE SAME

FIELD OF THE DISCLOSURE

The present disclosure relates to electronic devices and processes of forming electronic devices, and more particularly to, electronic devices including insulated gate bipolar transistors having field-stop regions and processes of forming the same.

RELATED ART

An insulated gate bipolar transistor can have a field-stop region adjacent to a collector region. The field-stop region has a conductivity type opposite of the collector region. The field-stop region can provide a more gradual rate of change of the emitter-to-collector voltage at relatively higher voltages during switching operations. A relatively deep field-stop region is desired; however, conventional processes may have adverse consequences. For example, a silicon-on-insulator process may have the field-stop region within an initial starting wafer. Such a process may have quality issues near the edge of the bonded substrates. Another process may involve a buried layer followed by a very thick epitaxial growth. Such a process may allow significant diffusion of dopant from the field-stop region. In another attempt to create a field-stop region, H$^+$ ions may be implanted at an energy along the order of a MeV. The implanted H+ ions can cause crystal damage that results in an excess of electrons rendering the implanted region n-type. Implant straggle ($\Delta R_P$) can be relatively high due to the energy. Thus, the processes described above can make controlling the shape of the field-stop region hard to control. Further improvements in insulated gate bipolar transistors are desired.

BRIEF DESCRIPTION OF THE DRAWINGS

Embodiments are illustrated by way of example and are not limited in the accompanying figures.

Figure 1:
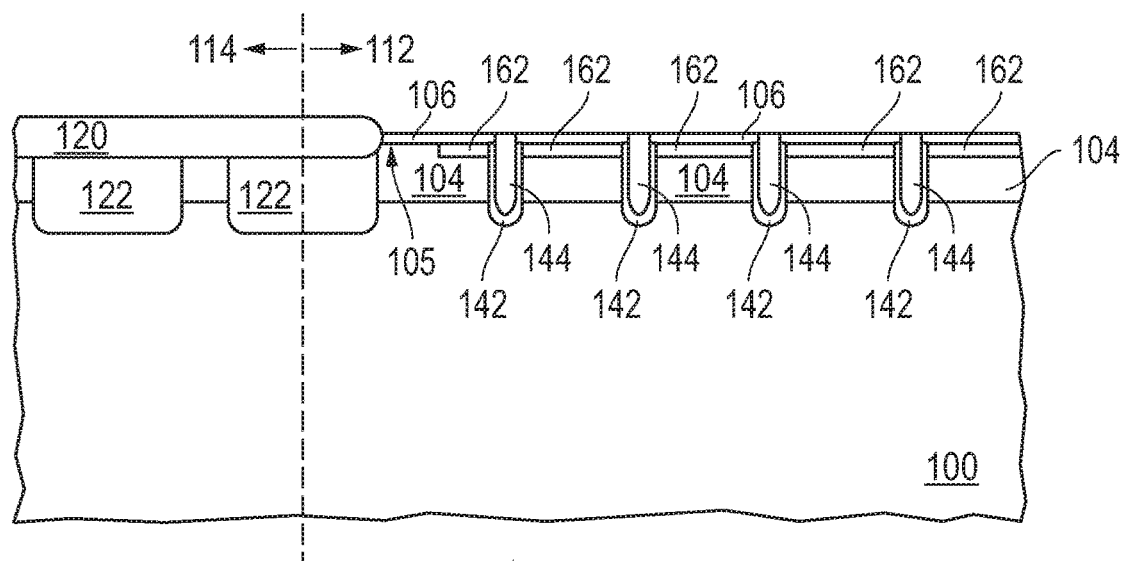
FIG. 1 includes an illustration of a portion of a workpiece including a semiconductor substrate, a well region, a pad layer, a gate electric layer, a gate electrode, and a field isolation region.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers correspond to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include an insulated gate bipolar transistor (IGBT) having structural features that are novel and produce electrical fields along the back side of the device that allow for good operating characteristics. The electronic device can include a semiconductor substrate, a collector region can be disposed at a major surface along the back side of the semiconductor substrate. Trenches can extend from the major surface into the semiconductor substrate. A field-stop region underlies the collector region and bottoms of the trenches and extends at least partly along sidewalls of the trenches. The widths and depths of the trenches can be tailored for a particular operating voltage of the IGBT. A collector terminal can contact the collector region and be electrically isolated from the field-stop region. Embodiments as described herein can allow for acceptable performance in an IGBT without processing that is complex or marginal, such as using wafer-to-wafer bonding, forming a field-stop region relatively early in a process flow, or the like.

In an aspect, an electronic device can include a semiconductor substrate having a first major side, a second major side opposite the first major side, and a second major surface along the second major side; an emitter region closer to the first major side than to the second major side, wherein the emitter region has a first conductivity type; a trench extending from the second major surface into the semiconductor substrate, wherein the trench has a sidewall and a bottom; a collector region along the second major surface and spaced apart from the bottom of the trench, wherein the collector region has a second conductivity type opposite the first conductivity type; a field-stop region lying along the bottom and at least a portion of the sidewall of the trench, wherein the field-stop region has the first conductivity type; and a collector terminal along the second major side and including a metal-containing material, wherein the collector terminal contacts the collector region and is isolated from the field-stop region.

In another aspect, a process of forming an electronic device can include forming an emitter region having a first conductivity type along a first major side of a semiconductor substrate; thinning the semiconductor substrate to define a second major surface along a second major side opposite the first major side, wherein the emitter region is closer to the first major side than the second major side; forming a collector region along the second major surface, wherein the collector region has a second conductivity type opposite the first conductivity type; patterning the semiconductor substrate to define a trench extending from the second major surface into the semiconductor substrate, wherein the trench has a sidewall and a bottom, and the collector region is spaced apart from the bottom of the trench; forming a field-stop region lying along the bottom and at least a portion of the sidewall of the trench, wherein the field-stop region has the first conductivity type; and forming a collector terminal along the second major side and including a metal-containing material, wherein the collector terminal contacts the collector region and is isolated from the field-stop region.

FIG. 1 includes an illustration of a cross-sectional view of a portion of a workpiece that includes a semiconductor substrate 100 having a component region 112, where at least one electronic component is formed, and a peripheral region 114 outside the component region 112. The component region 112 may also be referred to as an active region, and the peripheral region 114 may be referred to as a termination region. The semiconductor substrate 100 can include a Group 14 element (i.e., carbon, silicon, germanium, or any combination thereof) and can be lightly n-type or p-type doped. For the purposes of this specification, heavily doped is intended to mean a peak dopant concentration of greater than $2\times10^{17}$ atoms/cm$^3$, lightly doped is intended to mean a peak dopant concentration of less than $2\times10^{14}$ atoms/cm$^3$, and intermediate doped is intended to mean a peak dopant concentration in a range from $2\times10^{14}$ atoms/cm$^3$ to of less than $2\times10^{17}$ atoms/cm$^3$.

In an embodiment, the semiconductor substrate 100 has a dopant concentration less than $2\times10^{145}$ atoms/cm$^3$. In a particular embodiment, the semiconductor substrate 100 is n-type doped. As used herein, the dopant concentration of the semiconductor substrate 100 will be referred to herein as the background dopant concentration. Well regions 104 are formed along a major side of the semiconductor substrate 100 and have a conductivity type opposite the semiconductor substrate 100. The major side along which the well regions 104 are formed is also referred to as the front side. The well regions 104 are moderately doped and have a conductivity type opposite the conductivity type of the semiconductor substrate 100 and a dopant concentration greater than the background dopant concentration of the semiconductor substrate 100.

A pad layer 106 and an oxidation-resistant layer (not illustrated) are formed over the well regions 104. The pad layer 106 and the oxidation-resistant layer are patterned, and a field isolation region 120 is formed where the pad layer 106 and the oxidation-resistant layer are removed. The oxidation-resistant layer can then be removed. Doped isolation regions 122 can be formed and extend through the well regions 104 and into the semiconductor substrate 100. The doped isolation regions 122 can have a conductivity type opposite that of the semiconductor substrate 100.

A mask (not illustrated) is formed over the workpiece and defines openings where gate structures will be formed. An etch is performed to remove portions of the pad layer 106, the well regions 104, and semiconductor substrate 100 to define trenches in the component region 112 that extend from a major surface 105 along the front side. The trenches may extend only slightly into the semiconductor substrate 100 in order to reduce gate-to-drain capacitance. The etch may be performed as a timed etch or using endpoint detection (for example, based on interferometry) with a timed overetch. The mask can be removed after the trenches are formed. A gate dielectric layer 142 is formed along the exposed surfaces of the trenches. Gate electrodes 144 can be formed by depositing a conductive layer and removing portions of the conductive layer lying outside of the trenches. Another mask can be formed and define openings where emitter regions 162 are formed. The emitter regions 162 have a conductivity type opposite that of the well regions 104. The emitter regions 162 are heavily doped, and in a particular embodiment, are doped with arsenic with a dopant concentration of at least $1\times10^{19}$ atoms/cm$^3$. The portions of the well regions 104 along the sidewalls of the trenches and between the emitter regions 162 and the semiconductor substrate 100 are channel regions.

Figure 2:
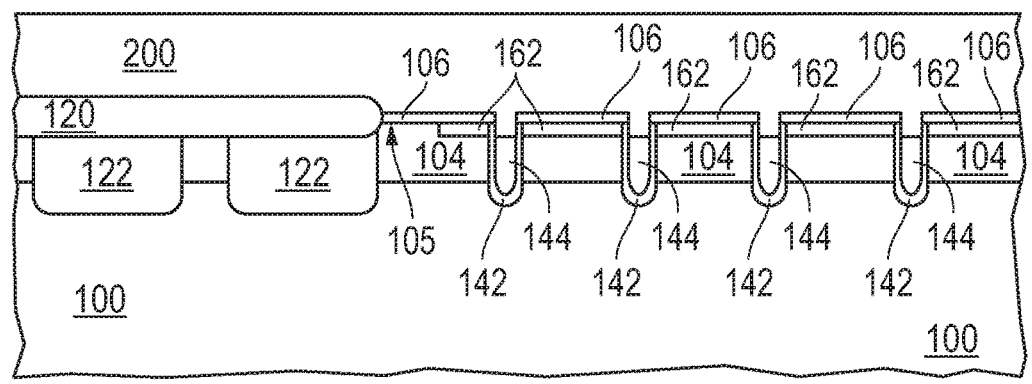
FIG. 2 includes an illustration of the workpiece of FIG. 1 after forming an interlayer dielectric layer.

Referring to FIG. 2, gate electrodes 144 can be recessed within the trenches to reduce gate-to-emitter capacitance. In the embodiment as illustrated, the gate electrodes span the channel regions and extend slightly beyond the emitter region-well region interface and the well region-semiconductor substrate interface. An interlevel dielectric (ILD) layer 200 is formed over the workpiece. The ILD layer 200 can include a single film or a plurality of films. The ILD layer 200 can include an oxide, a nitride, or an oxynitride film. In a particular embodiment, the ILD layer 200 can include a relatively thin etch-stop film, a relatively thick oxide film, and a relatively thin antireflective film. Many other variations on the ILD layer 200 are possible, and the ILD layer 200 can be tailored for a particular application.

Figure 3:
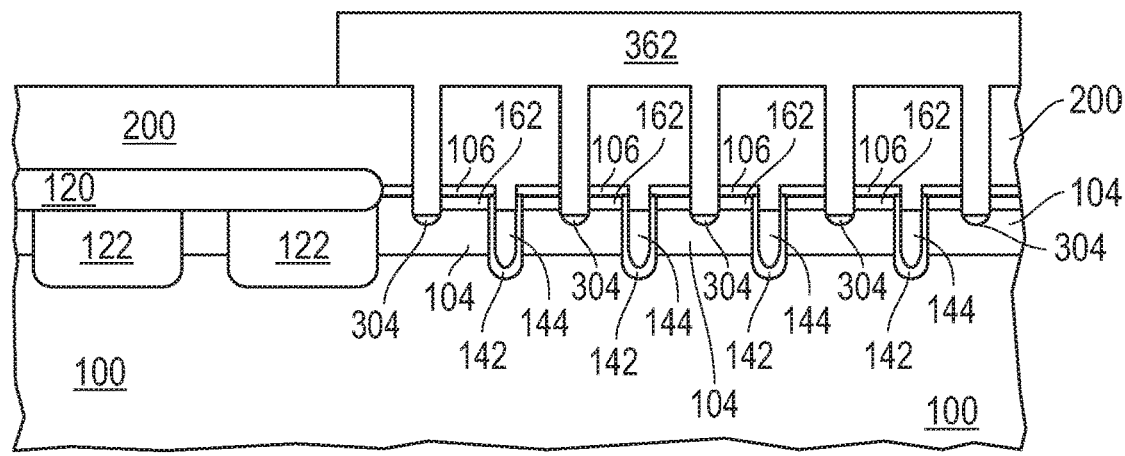
FIG. 3 includes an illustration of the workpiece of FIG. 2 after forming contact openings and an emitter terminal.
Figure 4:
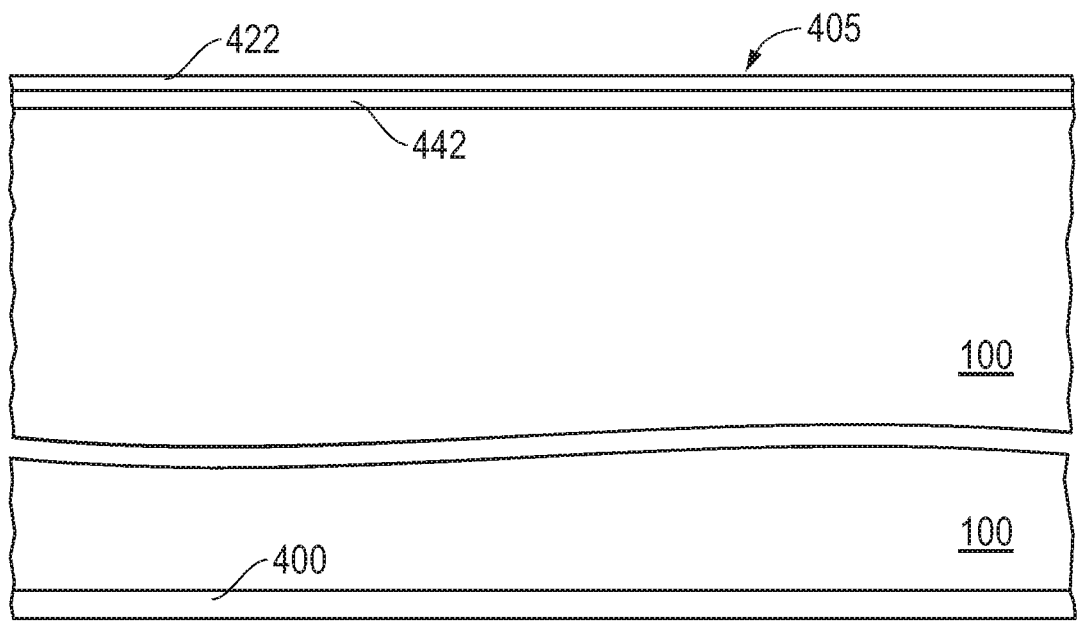
FIG. 4 includes illustrations of the workpiece of FIG. 3 after forming collector and shallow doped regions along a back side of the semiconductor substrate.

In FIG. 3, contact openings where contacts are to be made to the emitter regions 162. A doping step can be performed to form doped well contact regions 304 that allow ohmic contacts to be formed to the well region 104. Contact openings to the gate electrodes 144 may be made during the same or different patterning sequence; however, the gate electrodes 144 are not exposed during the doping operation to form the well contact regions 304.

A conductive layer for interconnects can be formed over the ILD layer 200 and within the contact openings. The conductive layer contacts the emitter regions 162, the well contact regions, and the gate electrodes 144. The conductive layer can include one or more films. For example, the conductive layer can include an adhesion film, a barrier film, and a conductive film that makes up most of conductive layer. The conductive film may include over 90 wt. % W for the conductive layer. The conductive layer is patterned to form an emitter interconnect 362 that is electrically connected to the emitter regions 162 and the well contact regions 304, and a gate interconnect (not illustrated) that is electrically connected to the gate electrodes 144.

One or more additional interconnect levels and a passivation layer may be formed over the workpiece. Each interconnect level can include an ILD layer and interconnects. A conductive layer can be used at each interconnect level. The conductive layer may be the same or different from the other conductive layer described earlier in this specification. In an embodiment, the emitter interconnect 362 or the gate interconnect may be formed at the same or different interconnect levels. At least one of the interconnect levels along the front side may include a conductive layer that includes over 90 wt. % Al, and thus, the temperature used in subsequent processing may be limited to avoid melting the conductive layer that includes over 90 wt. % Al. In another embodiment, the conductive layer may not include over 90 wt. % Al; however, the junctions for the doped regions along the front side (for example, emitter region 162, the well contact region 304, the well region 104, etc.) may be adversely affected if the subsequent processing allows for significant diffusion of dopant within such doped regions. At this point in the process, processing along the front side of the workpiece is substantially completed.

Processing along the opposite major side, referred to herein as the back side, of the workpiece can proceed. The processing along the back side focusses on the component region 112, and thus, FIGS. 4 to 9 do not illustrate the peripheral region 114, although the workpiece still has the peripheral region 114. The emitter regions 162, the gate electrodes 144, the well region 104, and other features along the front side of the semiconductor substrate 100 are collectively illustrated as component section 400 in FIGS. 4 to 9.

The thickness of the semiconductor substrate 100 within the component region 112 can depend on the designed voltage to be supported between the emitter and collector of the IGBT when the IGBT is in an off-state. In an embodiment, the thickness of the semiconductor substrate 100 within the component region 100 may be in a range from 50 microns to 500 microns, and in a particular embodiment is in a range from 110 microns to 300 microns. If needed or desired, the semiconductor substrate 100 can be thinned within the component region to achieve the desired thickness. Thinning may be performed by backgrinding the semiconductor substrate 100, etching the semiconductor substrate 100, or both backgrinding and etching the semiconductor substrate. The major surface 405 is along the back side of the semiconductor substrate 100.

A collector region 422 and a doped buffer portion 442 of a field-stop region are formed along the back side of the semiconductor substrate 100. In an embodiment, the collector region 422 has a conductivity type opposite the conductivity type of the semiconductor substrate 100 and the doped buffer portion 442. In an embodiment, the collector region 422 is p-type doped with a peak dopant concentration in a range from $1 \times 10^{16}$ atoms/cm$^3$ to $5 \times 10^{21}$ atoms/cm$^3$. The depth of the collector region 422 can be in a range from 0.1 micron to 1 micron.

The doped buffer portion 442 is relatively shallower as compared to other subsequently-formed portions of the field-stop region. The doped buffer portion 442 can be n-type doped. In an embodiment, the doped buffer portion 442 has a peak dopant concentration in a range from $1 \times 10^{15}$ atoms/cm$^3$ to $5 \times 10^{17}$ atoms/cm$^3$. The doped buffer portion 442 extends to a depth in a range from 1 micron to 4 microns below the major surface 405. Because the doped buffer portion 442 and the semiconductor substrate 100 may have the same conductivity type, the depth of the doped buffer portion 442 may be at a depth where the dopant concentration is significantly higher than the background dopant concentration in the semiconductor substrate 100. In a non-limiting example, the depth of the doped buffer portion 442 is where the dopant concentration is at least 20% higher than the background dopant concentration in the semiconductor substrate 100. The doped buffer portion 442 may be formed before or after the collector region 422 is formed.

Figure 5:
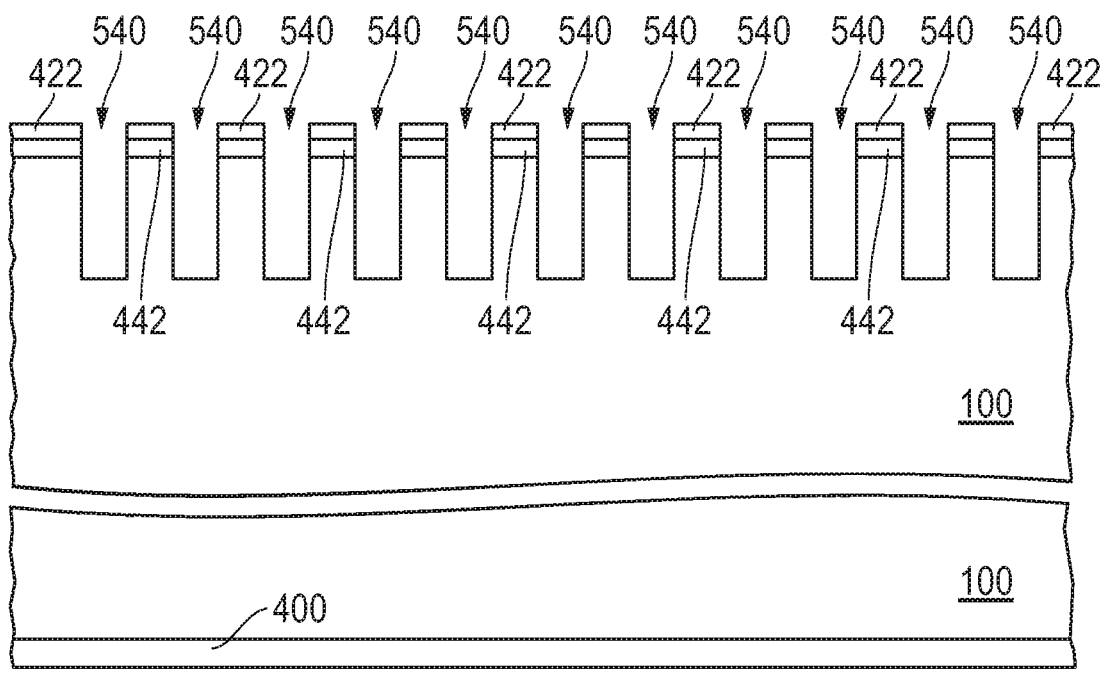
FIG. 5 includes illustrations of the workpiece of FIG. 4 after patterning a back side of the semiconductor substrate to define trenches.

FIG. 5 includes an illustration of the workpiece after patterning the semiconductor substrate 100 to define trenches 540. The trenches 540 can extend from the major surface 405 into the semiconductor substrate 100 to a depth in a range from 5 microns to half of the thickness of the semiconductor substrate 100 after thinning is completed. In an embodiment, the trenches 540 can have a width in a range from 1 micron to 10 microns. The particular depths and widths of the trench may have values outside of those previously described. After reading this specification, skilled artisans will be able to determine depths and widths of the trenches for a particular application.

Figure 6:
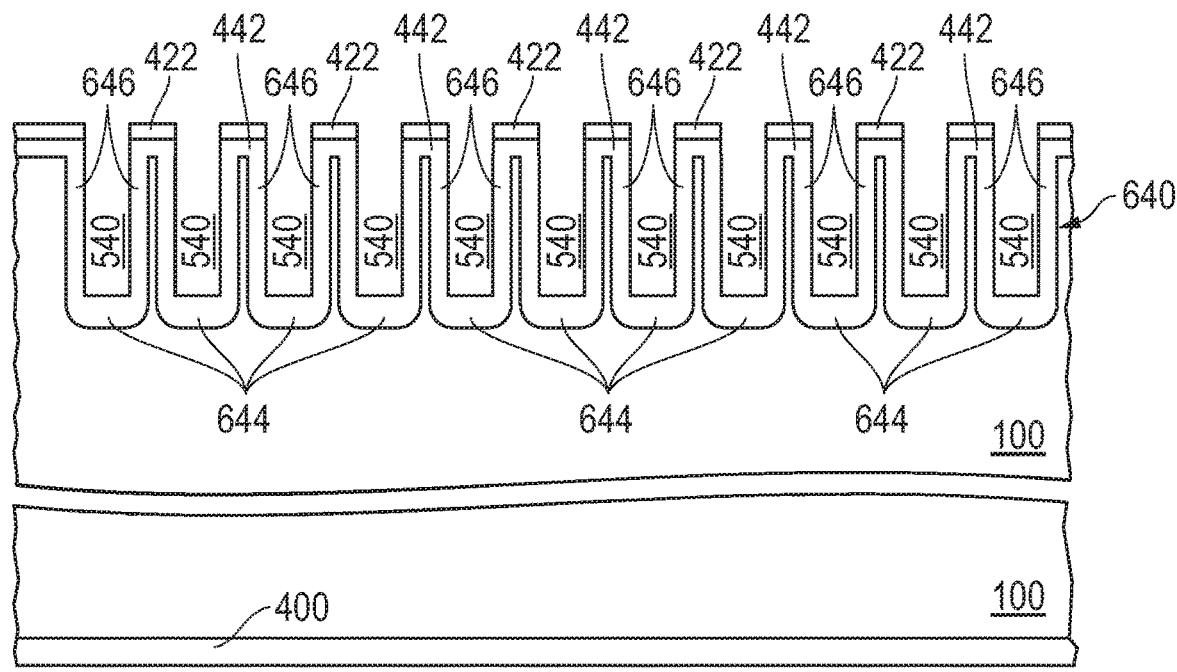
FIG. 6 includes an illustration of the workpiece of FIG. 5 after forming doped regions along bottoms and sidewalls of the trenches.

FIG. 6 includes an illustration of the workpiece after doping to form bottom portions 644 and sidewall portions 646 of the field-stop region 640. The bottom and sidewall portions 644 and 646 have the same conductivity type as the doped buffer portion 442. The bottom portions 644 can have a peak dopant concentration and depth as previously described with respect to the doped buffer portion 442. The bottom portions 644 can have substantially the same peak dopant concentration, substantially the same depth, or both substantially the same peak concentration and depth as compared to the doped buffer portion 442. The sidewall portions 646 can have a dopant concentration that is less than either or both of the doped buffer portion 442 and the bottom portions 644. The sidewall portions 646 can extend from the sidewall of the trench by a distance less than the depth of either or both of the doped buffer and the bottom portions 442 and 644. The sidewall portions 646 do not need to extend along the entire sidewalls. In an embodiment, the sidewall portions 646 may extend along at least 0.5 micron or at least 10 microns along the depths of the sidewalls. In another embodiment, the sidewall portions 646 may extend along at least 6% or at least 50% of the sidewalls. In the embodiment as illustrated, the field-stop region 640 lies along all of the trenches 540 except near the top of the trenches where the collector region 422 is located. Pillars, which are portions of the semiconductor substrate 100 between the trenches 540, may or may not be completely doped, and thus, the sidewall portions 646 may or may not extend through the entire width of the pillars.

The formation of the bottom and sidewall portions 644 and 646 can be performed during one or more doping operations. In an embodiment, a single ion implant can be performed to dope the bottoms and sidewalls of the trenches 540. In another embodiment, a doping operation may dope the bottoms and none of the sidewalls or dope the bottoms and part, but not all, of the sidewalls. A further doping operation may be performed at a different tilt angle to dope more of the sidewalls of the trenches 540. Hence, the sidewall portions 646 can be formed using a plurality of ion implantations at different tilt angles. In a further embodiment, the doped buffer portion 422 and the bottom portions 644 can be formed during the same doping operation, instead of different doping operations. In such an embodiment, the doped buffer portion 442 and the bottom portions 644 of the field-stop region 640 may have substantially the same peak dopant concentration and substantially the same depth. After reading this specification, skilled artisans will be able to determine a doping sequence to form the doped buffer 442, bottom portions 644, and sidewall portions 646 of the field-stop region 640.

Laser annealing can be performed to activate the dopants within the back side doped regions, including the collector region 422 and the doped buffer, bottom, and sidewall portions 442, 644, and 646 of the field-stop region 640. The laser can emit radiation can be in the infrared spectrum. Laser annealing can help to reduce heat seen along the front side of the semiconductor substrate 100. Thus, the likelihood of interconnects melting or doped regions diffusing along the front side of the semiconductor substrate 100 is substantially reduced or eliminated.

Figure 7:
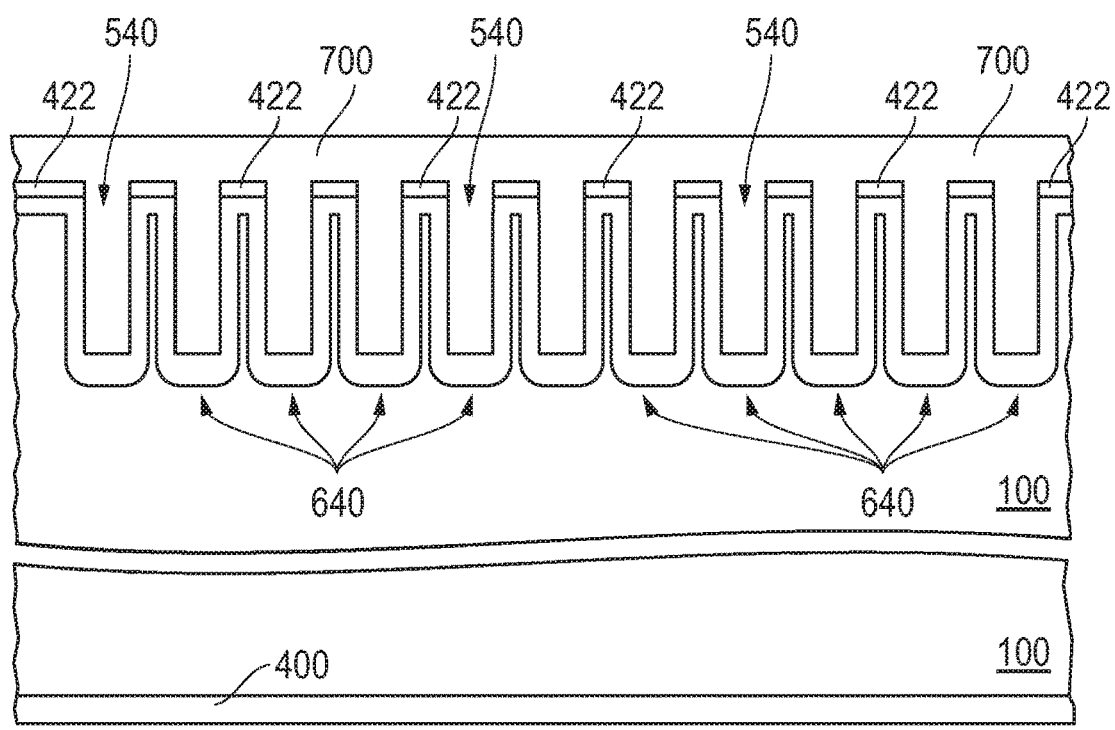
FIG. 7 includes an illustration of the workpiece of FIG. 6 after forming an insulating layer within the trenches and along a back side of the semiconductor substrate.

FIG. 7 includes an illustration after forming an insulating layer 700 over the collector regions 422 and within the trenches 540. The insulating layer 700 can include one or more films of an oxide, a nitride, or an oxynitride. In the embodiment as illustrated, the insulating layer 700 is formed at a temperature no higher than 600° C. to reduce the likelihood that an interconnect along the front side of the semiconductor substrate 100 would melt. In an embodiment, the insulating layer 700 is formed using a plasma-assisted chemical vapor deposition. In a particular embodiment, the insulating layer 700 includes an oxide, and tetraethyl orthosilicate (TEOS) is a precursor for the oxide. In the embodiment as illustrated, the insulating layer 700 completely fills the trenches 540. In another embodiment, the insulating layer 700 may fill only part of the trenches and a different material, such as silicon or another material having a coefficient of thermal expansion similar to the semiconductor substrate 100, can fill a remaining portion of the trenches 540.

Figure 8:
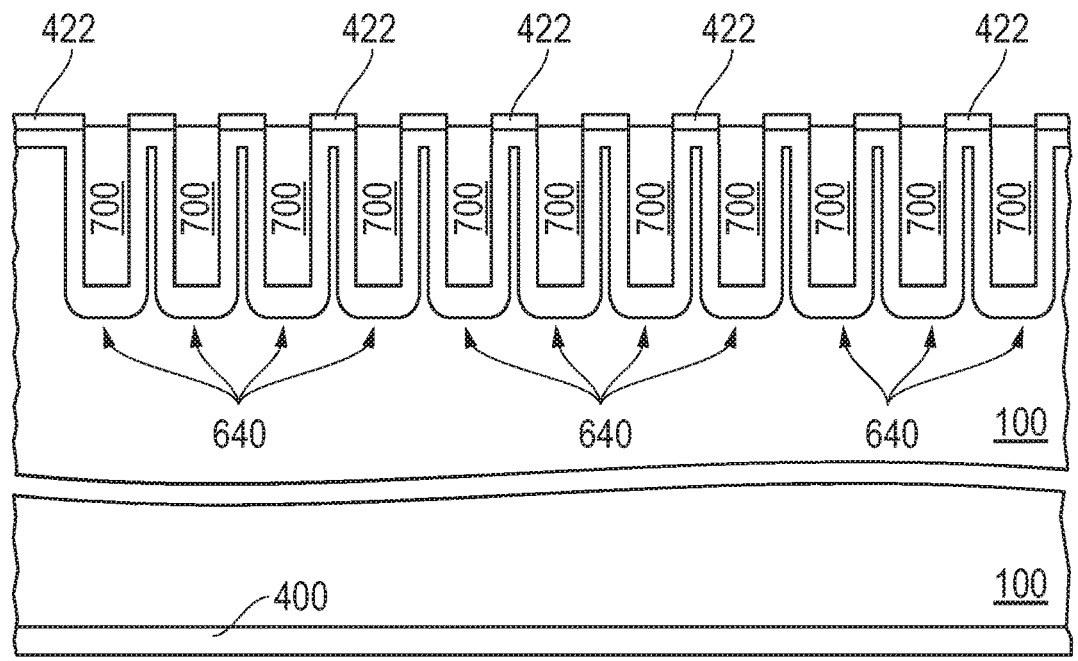
FIG. 8 includes an illustration of the workpiece of FIG. 7 after removing portions of the insulating layer outside the trenches.

Portions of the insulating layer 700 overlying the collector region 422 are removed as illustrated in FIG. 8. The portions can be removed using an etch or polishing process. In an embodiment, a dry etch is used and may be performed as a timed etch or using endpoint detection with a timed overetch. Care should be exercised to ensure that substantially none of the field-stop region 640 is exposed. Normally, the depth of the collector region 422 and control when removing portions of the insulating layer 700 are sufficient to substantially prevent the field-stop region 640 from becoming exposed. Thus, the insulating layer 700 will isolate the field-stop region 640 from a subsequently-formed collector terminal.

However, if the collector region 422 is relatively shallow (e.g., less than 0.3 micron), process control over the removal of the portions of the insulating layer 700 is poor, or both, parts of the field-stop region 640 may be exposed near the uppermost parts of the sidewalls (near the tops) of the trenches 540. A gap doped region (not illustrated) may be used to counter dope any exposed part of the field-stop region 640 to ensure the field-stop region 640 is isolated from the subsequently-formed collector terminal. The gap doped region may be performed using a dopant having the same conductivity type as the collector region 422 and using a tilt angle. The dopant concentration is selected to sufficiently counter dope the exposed portion of the field-stop region 640 and may or may not be as high as the peak dopant concentration of the collector region 422. In another embodiment, the collector region 422 may have a concentration significantly lower than $1 \times 10^{19}$ atoms/cm$^3$. A supplemental doping operation can be performed similar to forming the well contact regions 304 to increase the dopant concentration near the upper surface of the collector region 422 to ensure an ohmic contact is formed to a subsequently-formed collector terminal. Laser annealing may be performed to activate dopant within the gap or supplemental doped region.

Figure 9:
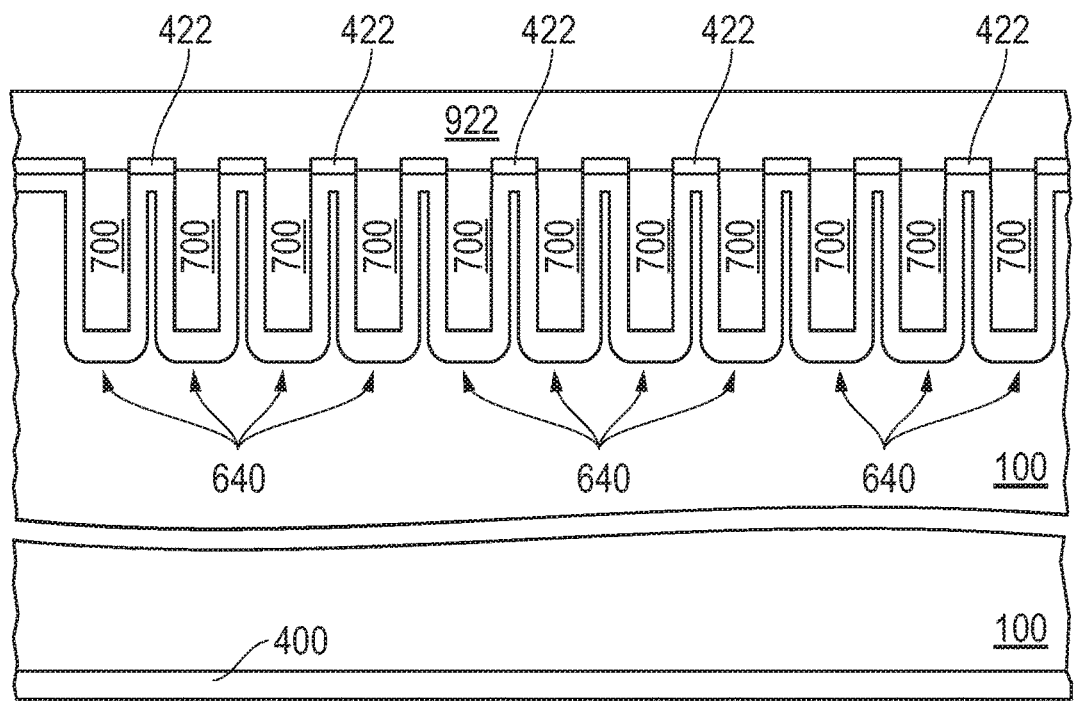
FIG. 9 includes an illustration of the workpiece of FIG. 8 after forming a collector terminal along the back side of the semiconductor substrate.

FIG. 9 includes an illustration of the workpiece after forming a collector terminal 922 along the back side of the semiconductor substrate 100. The collector terminal 922 contacts the collector region 422 and is electrically isolated from the field-stop region 640. In the embodiment as illustrated, the collector terminal 922 does not extend significantly into the trenches 540. Thus, the electronic device can be formed with trenches along the back side where substantially no conductive material is formed within the trenches 540. The collector terminal 922 can be formed using a plating technique, such as plating nickel, copper, or gold, or may be formed by depositing a metal film using another technique.

Figure 10:
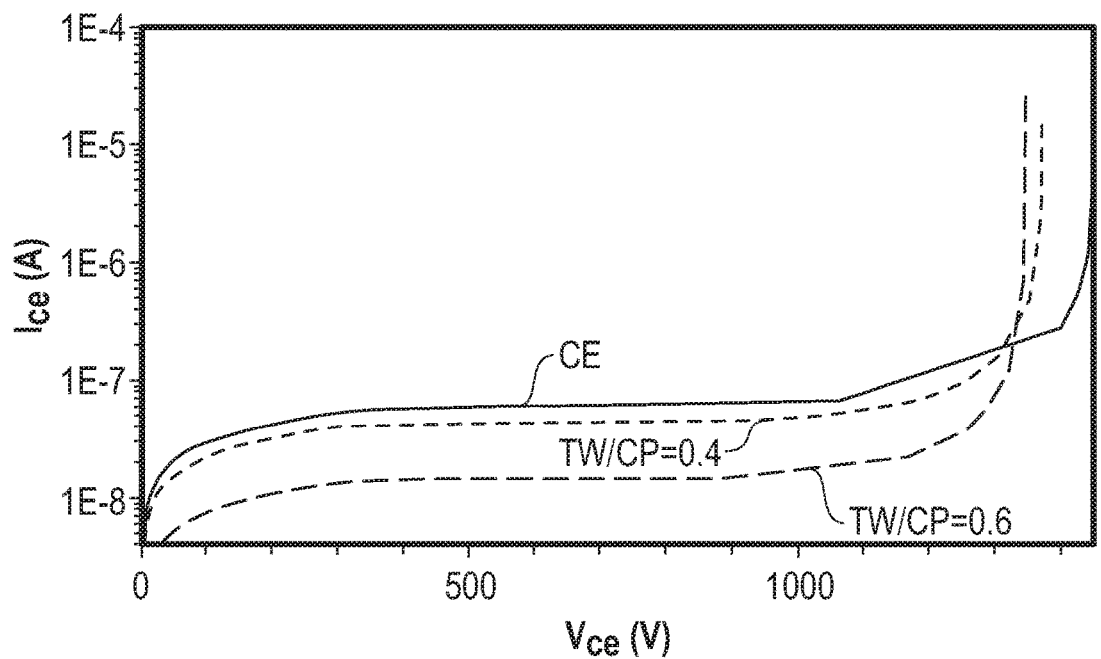
FIG. 10 includes plots of collector current as a function of collector voltage for a comparative example and embodiments with two different ratios of TW/CP.

FIG. 10 includes simulation plots of collector current (Ice) as a function of collector voltage (Vce). One of the plots is for a comparative example (CE in FIG. 10), another plot is for an embodiment in which the trench width/cell pitch (TW/CP) of 0.4, and a further plot is for an embodiment in which the TW/CP of 0.6. While comparative example has a more gradual increase in Ice at Vce higher than 1000 V, the comparative example uses a much more complex process, which is undesired. The embodiments where TW/CP is 0.4 and 0.6 are acceptable for a part that is designed for an off-state Vce of 800 V.

Figure 11:
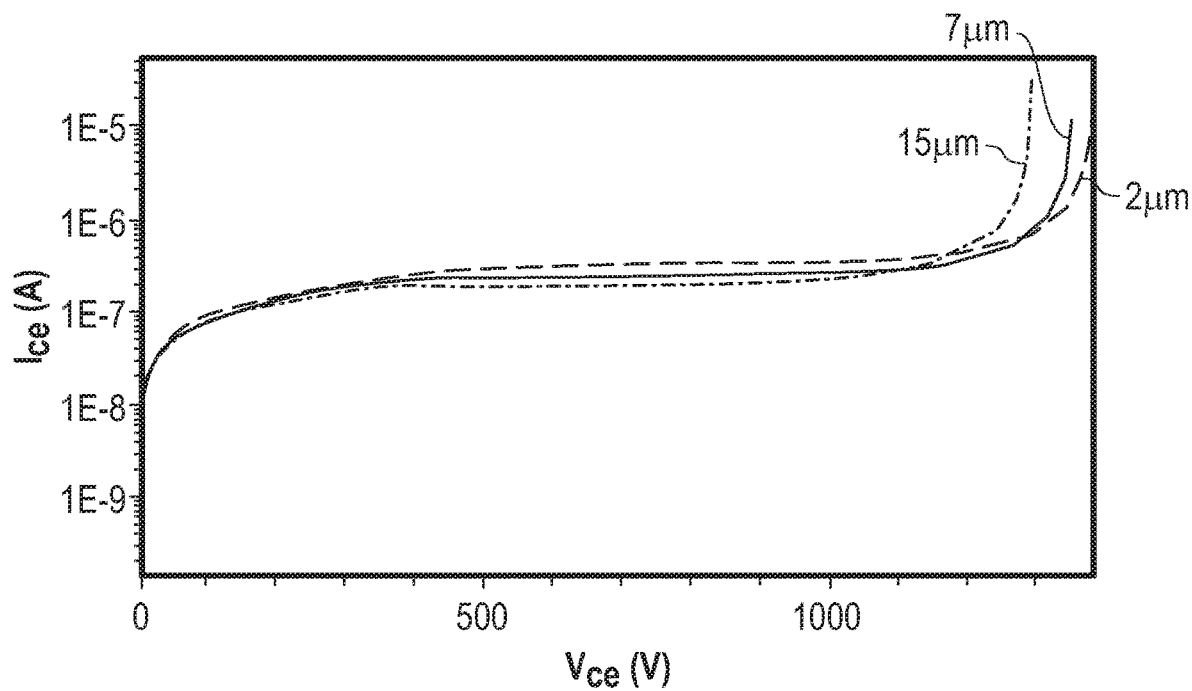
FIG. 11 includes plots of collector current as a function of collector voltage for embodiments with different trench widths.
Figure 12:
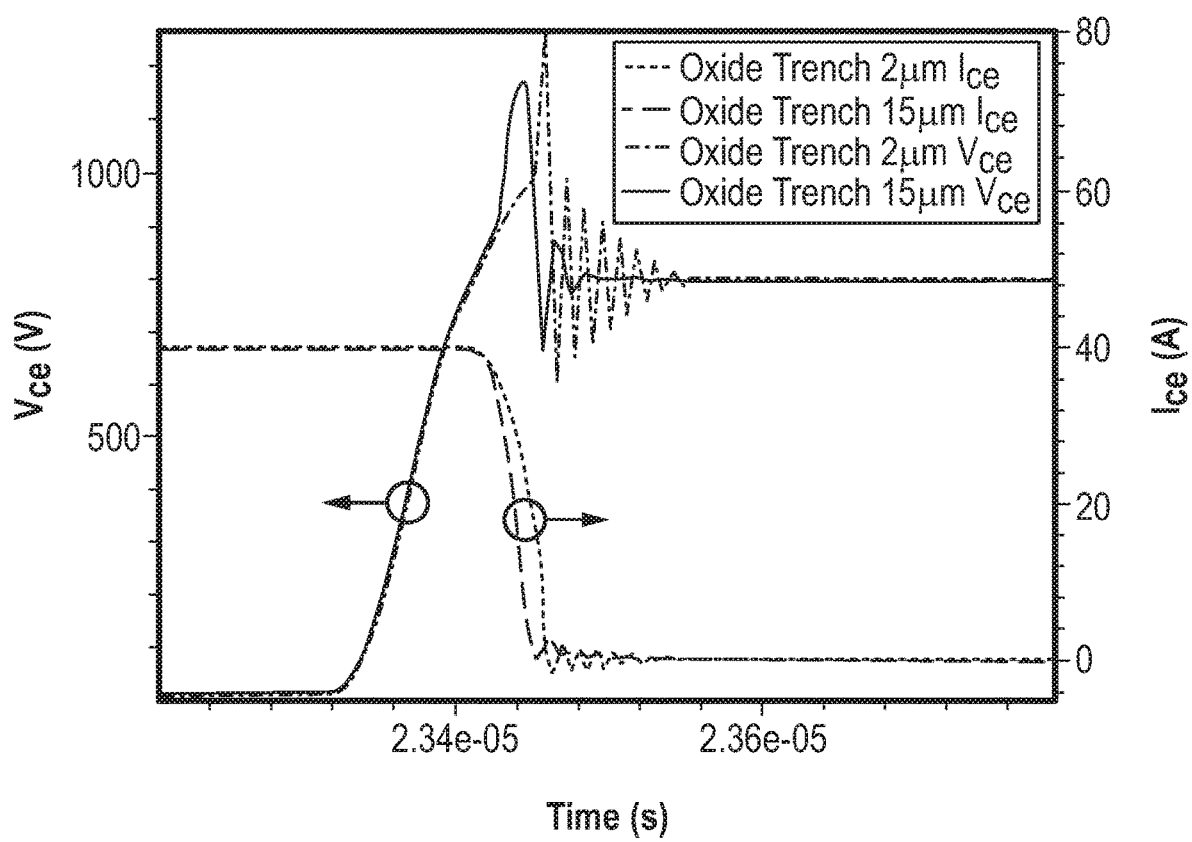
FIG. 12 includes plots of collector current and collector voltage as a function of time for embodiments with different trench widths.

FIG. 11 includes simulation plots of Ice as a function of Vce for trench depths of 2 microns, 7, microns, and 15 microns. For Vce in the range from 500 V to 800 V, Ice increases substantially linearly. At Vce higher than 800 V, the rate of change in Ice as a function of Vce increases more gradually for a trench depth of 15 microns, as compared to 7 microns, which has a more gradual rate of change in Ice as a function of Vce as compared to 2 microns. FIG. 12 includes plots of Vce and Ice as a function of time before and after switching operations when the trench depth is 2 microns and 15 microns. When the transistor is turned off, Ice decreases and Vce increases. As can be seen in FIG. 12, significantly less ringing occurs when the trench depth is 15 microns as compared to 2 microns. The data suggest that a deeper trench performs better than a shallower trench.

Further simulations can be performed to obtain a more optimal depth for a particular collector region dopant concentration and application.

Embodiments as described herein can allow for acceptable performance in an IGBT without using processing that is complex or marginal. The electronic device can include structural features that are novel and produce electrical fields along the back side of the device that allow for good operating characteristics. The process can include patterning the back side of a semiconductor substrate and introducing a dopant for a field-stop region along the bottoms of and outside the trenches. Although some dopant for the field-stop region is along the sidewall of the trenches, the extent of dopant along the sidewalls can be varied as needed or desired for a particular application. The collector region is spaced apart from the bottom of the trenches. A collector terminal can contact the collector region and be isolated from the field-stop region. The electronic device can be achieved using a process that does not require wafer-to-wafer bonding, forming a field-stop region relatively early in a process flow followed by growing a thick epitaxial layer, or the like.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include:
a semiconductor substrate having a first major side, a second major side opposite the first major side, and a second major surface along the second major side;
an emitter region closer to the first major side than to the second major side, wherein the emitter region has a first conductivity type;
a trench extending from the second major surface into the semiconductor substrate, wherein the trench has a sidewall and a bottom;
a collector region along the second major surface and spaced apart from the bottom of the trench, wherein the collector region has a second conductivity type opposite the first conductivity type;
a field-stop region lying along the bottom and at least a portion of the sidewall of the trench, wherein the field-stop region has the first conductivity type; and
a collector terminal along the second major side and including a metal-containing material, wherein the collector terminal contacts the collector region and is isolated from the field-stop region.

Embodiment 2

The electronic device of Embodiment 1 further includes an insulating layer lying along the sidewall and bottom of the trench, wherein the insulating layer is disposed between the field-stop region and the collector terminal.

Embodiment 3

The electronic device of Embodiment 2, wherein the insulating layer substantially fills the trench.

Embodiment 4

The electronic device of Embodiment 1, wherein the field-stop region extends along the sidewall for at least 0.5 micron of the depth of the trench.

Embodiment 5

The electronic device of Embodiment 1, wherein the field-stop region includes a buffer region contacting the collector region and having the first conductivity type, wherein the buffer region is spaced apart from the bottom of the trench.

Embodiment 6

The electronic device of Embodiment 1, wherein the field-stop region includes a first portion, second portion, and a third portion, wherein the first portion underlies and contacts the collector region, the third portion lies along the bottom of the trench, and the second portion lies along the sidewall of the trench and between the first and third portions, wherein the second portion has a lower dopant concentration as compared to each of the first and third portions.

Embodiment 7

The electronic device of Embodiment 6, wherein the first portion, the third portion, or both have a peak dopant concentration in a range from $1\times10^{15}$ atoms/cm$^3$ to $1\times10^{17}$ atoms/cm$^3$.

Embodiment 8

The electronic device of Embodiment 6, wherein a peak dopant concentration of the third portion lies at a depth in a range from 0.2 micron to 4 microns from the second major surface.

9. The electronic device of Embodiment 1, wherein the trench has a depth in a range from 10 microns to 25 microns.

Embodiment 10

The electronic device of Embodiment 9, wherein the trench has a width in a range from 1 micron to 4 microns.

Embodiment 11

The electronic device of Embodiment 1, wherein the electronic device includes an insulated gate bipolar transistor that includes the emitter region, the trench, the collector region, the field-stop region, and the collector terminal.

Embodiment 12

A process of forming an electronic device including:
forming an emitter region having a first conductivity type along a first major side of a semiconductor substrate;
thinning the semiconductor substrate to define a second major surface along a second major side opposite the first major side, wherein the emitter region is closer to the first major side than the second major side;
forming a collector region along the second major surface, wherein the collector region has a second conductivity type opposite the first conductivity type;

patterning the semiconductor substrate to define a trench extending from the second major surface into the semiconductor substrate, wherein the trench has a sidewall and a bottom, and the collector region is spaced apart from the bottom of the trench;

forming a field-stop region lying along the bottom and at least a portion of the sidewall of the trench, wherein the field-stop region has the first conductivity type; and forming a collector terminal along the second major side and including a metal-containing material, wherein the collector terminal contacts the collector region and is isolated from the field-stop region.

Embodiment 13

The process of Embodiment 12, wherein forming the field-stop region includes forming a portion of the field-stop region along the second major side, wherein in a finished device, the portion of the field-stop region is spaced apart from the bottom of the trench.

Embodiment 14

The process of Embodiment 13, wherein forming the collector region and forming the portion of the field-stop region are performed before pattern the semiconductor substrate to define the trench.

Embodiment 15

The process of Embodiment 12, wherein forming the field-stop region includes forming a first portion and forming a second portion of the field-stop region, wherein the first portion lies along the bottom of the trench, and the second portion lies along a sidewall of the trench.

Embodiment 16

The process of Embodiment 15, wherein forming the second portion of the field-stop region includes implanting a dopant at different tilt angles during different ion implantations.

Embodiment 17

The process of Embodiment 12, further includes laser annealing to activate dopants for the collector region and the field-stop regions.

Embodiment 18

The process of Embodiment 12, further includes forming an insulating layer along the bottom and sidewall of the trench, wherein the insulating layer is disposed between the field-stop region and the collector terminal.

Embodiment 19

The process of Embodiment 18, wherein forming the insulating layer includes depositing an insulating material using a plasma-enhanced deposition with tetraethyl orthosilicate as a precursor of an insulating material within the insulating layer.

Embodiment 20

The process of Embodiment 18, wherein forming the insulating layer includes filling the trench with an insulating material.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a semiconductor substrate having a first major side, a second major side opposite the first major side, and a major surface along the second major side;
   an emitter region closer to the first major side than to the second major side, wherein the emitter region has a first conductivity type;
   a trench extending from the major surface into the semiconductor substrate, wherein the trench has a sidewall and a bottom;
   a collector region along the major surface and spaced apart from the bottom of the trench, wherein the collector region has a second conductivity type opposite the first conductivity type;
   a field-stop region lying along the bottom and at least a portion of a sidewall of the trench, wherein the field-stop region has the first conductivity type; and
   a collector terminal along the second major side and including a metal-containing material, wherein the collector terminal contacts the collector region and is isolated from the field-stop region.

2. The electronic device of claim 1, further comprising an insulating layer lying along the sidewall and bottom of the trench, wherein the insulating layer is disposed between the field-stop region and the collector terminal.

3. The electronic device of claim 2, wherein the insulating layer substantially fills the trench.

4. The electronic device of claim 1, wherein the field-stop region extends along the sidewall for at least 0.5 micron of the depth of the trench.

5. The electronic device of claim 1, wherein the field-stop region comprises a buffer region contacting the collector region and having the first conductivity type, wherein the buffer region is spaced apart from the bottom of the trench.

6. The electronic device of claim 1, wherein the field-stop region comprises a first portion, second portion, and a third portion, wherein:
   the first portion underlies and contacts the collector region,
   the third portion lies along the bottom of the trench, and
   the second portion lies along the sidewall of the trench and between the first and third portions, wherein the second portion has a lower dopant concentration as compared to each of the first and third portions.

7. The electronic device of claim 6, wherein the first portion, the third portion, or both have a peak dopant concentration in a range from $1 \times 10^{15}$ atoms/cm$^3$ to $1 \times 10^{17}$ atoms/cm$^3$.

8. The electronic device of claim 6, wherein a peak dopant concentration of the third portion lies at a depth in a range from 0.2 micron to 4 microns from the major surface.

9. The electronic device of claim 1, wherein the trench has a depth in a range from 10 microns to 25 microns.

10. The electronic device of claim 9, wherein the trench has a width in a range from 1 micron to 4 microns.

11. The electronic device of claim 1, wherein the electronic device comprises an insulated gate bipolar transistor that includes the emitter region, the trench, the collector region, the field-stop region, and the collector terminal.

12. A process of forming an electronic device comprising:
   forming an emitter region having a first conductivity type along a first major side of a semiconductor substrate;
   thinning the semiconductor substrate to define a major surface along a second major side opposite the first major side, wherein the emitter region is closer to the first major side than the second major side;
   forming a collector region along the major surface, wherein the collector region has a second conductivity type opposite the first conductivity type;
   patterning the semiconductor substrate to define a trench extending from the major surface into the semiconductor substrate, wherein the trench has a sidewall and a bottom, and the collector region is spaced apart from the bottom of the trench;
   forming a field-stop region lying along the bottom and at least a portion of the sidewall of the trench, wherein the field-stop region has the first conductivity type; and
   forming a collector terminal along the second major side and including a metal-containing material, wherein the collector terminal contacts the collector region and is isolated from the field-stop region.

13. The process of claim 12, wherein forming the field-stop region comprises forming a portion of the field-stop region along the second major side, wherein in a finished device, the portion of the field-stop region is spaced apart from the bottom of the trench.

14. The process of claim 13, wherein forming the collector region and forming the portion of the field-stop region are performed before pattern the semiconductor substrate to define the trench.

15. The process of claim 12, wherein forming the field-stop region comprises forming a first portion and forming a second portion of the field-stop region, wherein the first portion lies along the bottom of the trench, and the second portion lies along a sidewall of the trench.

16. The process of claim 15, wherein forming the second portion of the field-stop region comprises implanting a dopant at different tilt angles during different ion implantations.

17. The process of claim 12, further comprising laser annealing to activate dopants for the collector region and the field-stop regions.

18. The process of claim 12, further comprising forming an insulating layer along the bottom and sidewall of the trench, wherein the insulating layer is disposed between the field-stop region and the collector terminal.

19. The process of claim 18, wherein forming the insulating layer comprises depositing an insulating material using a plasma-enhanced deposition with tetraethyl orthosilicate as a precursor of an insulating material within the insulating layer.

20. The process of claim 18, wherein forming the insulating layer comprises filling the trench with an insulating material.

* * * * *